United States Patent
Greene et al.

[11] Patent Number: 5,860,076
[45] Date of Patent: Jan. 12, 1999

[54] 48-BIT WIDE MEMORY ARCHITECTURE ADDRESSING SCHEME RECONFIGURABLE FOR 8-BIT, 16-BIT AND 32-BIT DATA ACCESSES

[75] Inventors: Spencer H. Greene, Palo Alto; Andrew D. Daniel, San Jose, both of Calif.

[73] Assignee: Alliance Semiconductor Corporation, San Jose, Calif.

[21] Appl. No.: 584,383

[22] Filed: Jan. 11, 1996

[51] Int. Cl.⁶ .................................................. G06F 12/04
[52] U.S. Cl. .............................. 711/1; 395/509; 395/516
[58] Field of Search ............................ 395/421.02, 507, 395/509, 515, 516, 886, 307, 411, 410, 402; 345/27, 28, 190, 200; 711/1, 2, 200, 201

[56] References Cited

U.S. PATENT DOCUMENTS

| | | | |
|---|---|---|---|
| 4,868,740 | 9/1989 | Kagimasa et al. | 711/2 |
| 5,396,608 | 3/1995 | Garde | 711/200 |
| 5,559,969 | 9/1996 | Jennings | 395/307 |

*Primary Examiner*—Eddie P. Chan
*Assistant Examiner*—Kevin Verbrugge
*Attorney, Agent, or Firm*—Abdy Raissinia

[57] ABSTRACT

A memory addressing method and system is disclosed. In a preferred embodiment, a 48-bit wide memory array is provided wherein eight, 32-bit groups of data are addressable at six (6) memory address locations. Six of the eight 32-bit data groups are addressable at the six memory address locations, while the remaining two 32-bit groups are addressable at aligned, memory address pairs. No page break will occur across the memory address pairs. The contents of the memory are accessed through linear and contiguous addressing. No divide by three operation is required.

16 Claims, 7 Drawing Sheets

48-BIT WIDE MEMORY ARCHITECTURE ADDRESSING SCHEME RECONFIGURABLE FOR 8-BIT, 16-BIT AND 32-BIT DATA ACCESSES

TECHNICAL FIELD

The present invention relates generally to memory systems for computers, and more particularly to computer memory addressing schemes.

BACKGROUND OF THE INVENTION

Computer system memory architectures are typically arranged with word bit widths that are a power of two (such as thirty-two and sixty-four) which provide for easy translation of linear byte addresses to word addresses by simple binary shift operations. Presently, thirty-two bit wide architectures are commonly provided by four "by eight" dynamic random access memories (DRAMs) or two "by sixteen" DRAMs. As computer system applications become more demanding, computer memory system sizes have grown. In expanding a 32-bit wide memory system, typical prior art approaches have required a jump to 64-bits or an increase in address width. In both cases the minimum expanded size is typically twice the baseline 32-bit memory size. For many applications the baseline 32-bit memory size may be too small, but twice the memory baseline is more than needed, resulting in unnecessary cost in a system.

It is possible to implement memory sizes having widths that are not a power of two. For example, a 32-bit wide memory can be increased by a factor of 1.5 by employing six "by eight" or three "by sixteen" DRAMs to provide a 48-bit wide architecture. While such an approach increases memory size without having to double memory size, such architectures are typically avoided, due to the difficulty of implementation, and of providing acceptable performance.

Figure 1:
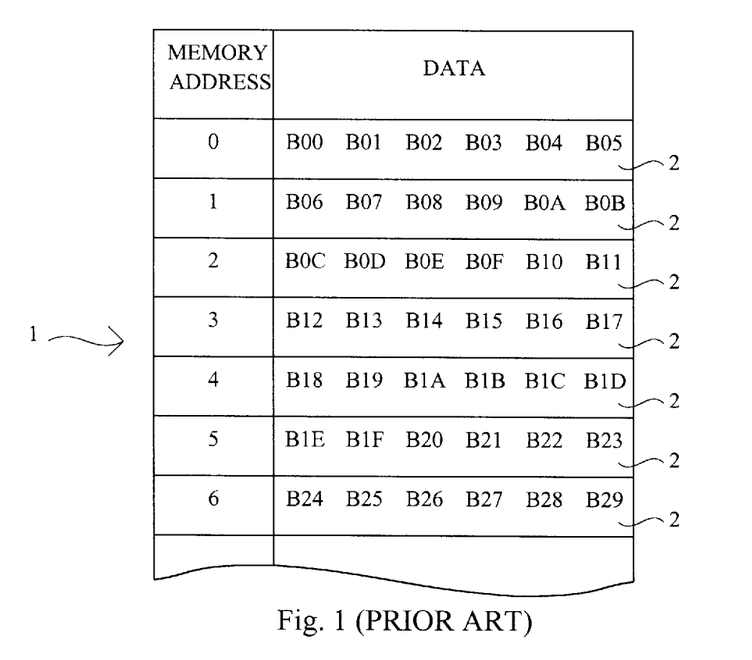
FIG. 1 is a diagrammatic representation of a 48-bit wide "packed" memory array storing eight bit addressable bytes.

Referring now to FIG. 1, a 48-bit wide memory array 1 is illustrated. The memory 1 consists of a series of 48-bit wide addressable locations 2, each corresponding to a particular word address (shown as 0–6 in the figure). The memory 1 is "packed", with each addressable location 2 being entirely filled by byte addressable data. The byte addressable data are represented by the symbol Bn, where n is a hexadecimal number. The inherent drawback of the memory arrangement in FIG. 1 is that the translation from a linear byte address to the word address used to access individual memory devices requires a divide-by-three operation. For example, to access byte Bn would require generating memory address n/6, which is the equivalent to a binary shift and divide by three. Such an operation is difficult to implement, and adds unwanted delay and complexity, whether implemented in software or hardware. Therefore, 48-bit wide architectures have typically been avoided.

Commonly-owned, U.S. Pat. No. 5,598,526 entitled METHOD AND SYSTEM FOR DISPLAYING IMAGES USING DYNAMICALLY RECONFIGURABLE DISPLAY MEMORY ARCHITECTURE and issued to Andrew D. Daniel et al, on Jan. 28,1997 incorporated by reference herein, discloses a memory system having a 48-bit wide architecture wherein 8-bit, 16-bit and 24-bit pixel regions share the same memory. The memory system makes a 48-bit wide memory array usable for 24-bit RGB pixel data, while at the same time, being reconfigurable to 32-bit or 64-bit pixel depths. A drawback to the system disclosed in Daniel et al. is that in reconfiguring the 48-bit wide system for use with non-24-bit pixel data, one third of available RAM storage is lost.

SUMMARY OF THE INVENTION

It is an object of the present invention to provide a high speed addressing scheme for a memory system having a width, in bits, that is a multiple of three.

It is another object of the present invention to provide an addressing scheme for a memory system having a width, in bits, that is not a power of two, that does not require a divide by three operation to access the data.

It is another object of the present invention to provide a memory system wherein data can be accessed in word sizes that are a power of two from an array that has a word width that is not a power of two, such that the addressing appears linear.

It is another object of the present invention to provide a memory system wherein data can be accessed in linear addressable word sizes that are a power of two, from an array that has a bit width that is not a power of two, such that the addressing appearing contiguous.

According to a preferred embodiment of the present invention, a 48-bit wide memory array is provided wherein every three memory addresses are used to store four, 32-bit data words. Three of the four 32-bit data words are accessed at individual memory addresses, while the fourth 32-bit data word is accessed across two memory addresses.

According to one aspect of the present invention, the memory system is divided into chunks of six memory addresses each storing eight 32-bit data words. Six of the 32-bit data words are each addressable at one of the six memory addresses, while the remaining two 32-bit data words are "double-pump" groups that straddle two successive memory addresses. The double-pump words are positioned so that a page break will not occur between their respective two successive memory addresses.

An advantage of the present invention is that it provides an addressing scheme for a memory array having bit-width that is not a power of two, that eliminates the possibility of a page break occurring during a read or a write operation.

Yet another advantage of the present invention is that it provides an addressing scheme for a memory system having a bit-width that is not a power of two, wherein all reads or writes occur at a single memory address or along aligned, successive address pairs.

Other objects and advantages of the invention will become apparent in light of the following description thereof.

DETAILED DESCRIPTION OF THE EMBODIMENTS

The preferred embodiment of the present invention is a 48-bit wide memory system that is used as a frame buffer in a graphics display system.

Figure 2:
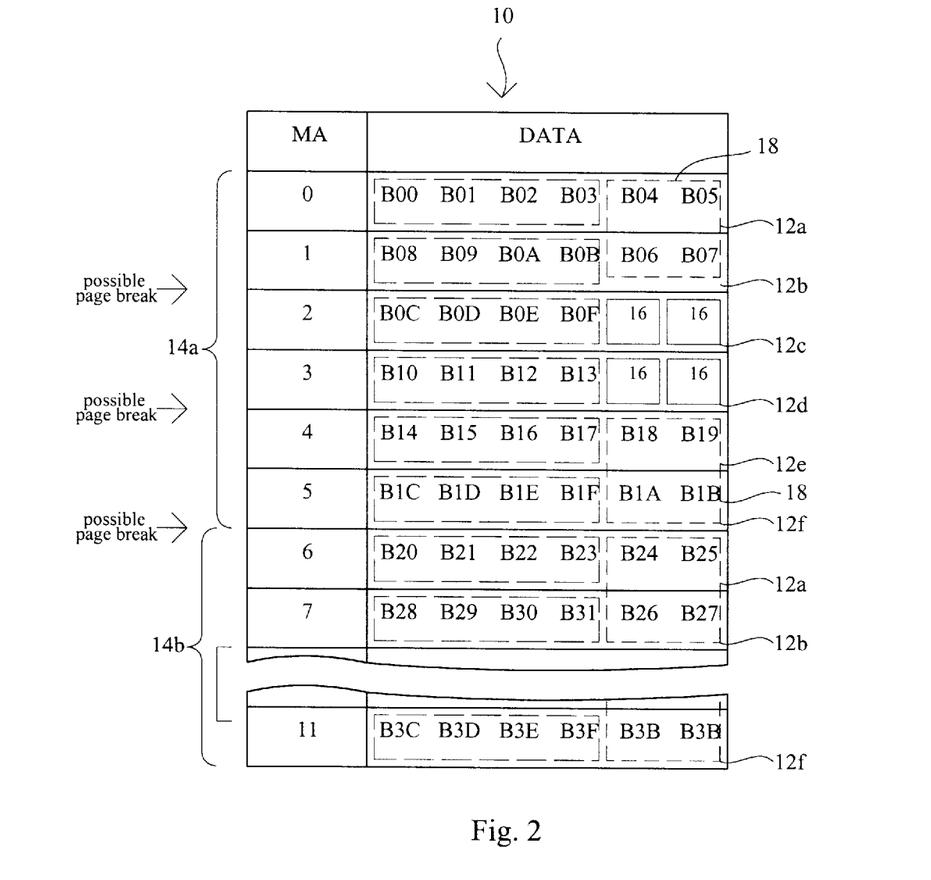
FIG. 2 is a diagrammatic representation of a memory array according to a preferred embodiment of the present invention.

Referring now to FIG. 2, a memory array 10 is set forth to describe the data arrangement of a preferred embodiment. The memory array 10 is composed of three 256k×16 DRAMs, and so has 256k addressable locations (words) 12, each having a width of 48-bits. Each addressable location 12 has a corresponding memory address (shown in the column "MA"). The data of the memory array 10 are arranged in 8-bit bytes, with each addressable location 12 storing six bytes. The bytes are identified by the symbol B, followed by an hexadecimal number (B00–B27).

Unlike the packed case of FIG. 1, the present invention does not utilize every byte of the memory. Two of every eighteen (18) bytes are not accessed. As a result, the memory array 10 can be conceptualized as being divided into consecutive groups, referred to herein as "chunks" 14, of six addressable locations 12. Four of the locations hold six bytes of data, and two of the locations hold four bytes of data.

In the memory array 10 of FIG. 2, a first memory chunk 14a is set forth, followed by a portion of a subsequent memory chunk 14b. Each chunk 14 consists of six addressable locations, shown as 12(a–f). The first addressable location 12a holds bytes B00–B05, the second 12b holds bytes B06–B0B, and the third 12c holds bytes B0C–B0F. The last three addressable locations are arranged in a similar fashion to the first three, with the fourth addressable location 12d holding bytes B10–B13, the fifth 12e holding bytes B14–B19, and the sixth 12f holding bytes B1A–B1F. The last two byte positions of the third and fourth addressable locations 12(c–d) are the bytes that are not accessed. Hence, for the purposes of this description, these positions will be considered empty data locations 16. It is noted that in the preferred embodiment, the physical layout of the byte order is not sequential. Bytes B06 and B07 occupy the last two byte positions of the second addressable location 12b, instead of the first two. Similarly, bytes B1A–B1B occupy the last two byte locations of the sixth addressable location 12f. The byte order arrangement illustrated in FIG. 2 is repeated for every chunk 14 of the memory array 10. When the depth of the memory array is not an even multiple of the six word chunk size, the last (1–5) words are not used.

Because every group of six addressable locations 12 stores 32 bytes of data, the memory address for the high order address bits localizing to a particular chunk 14, referred to herein as a chunk base address (CBA), can be computed as $$CBA = \frac{ByteAddress}{32} \times 6$$
$$= (ByteAddress >> 5)6$$
$$= (ByteAddress >> 5) \times (2 + 4)$$
$$= (ByteAddress >> 4) + (ByteAddress >> 3)$$

with the ">>" symbol representing a shift operation. The details of addressing words within a particular chunk 14 are explained below. Here it is sufficient to note that the chunk base address CBA, as a function of the linear byte address, can be computed by two simple shift operations and one add operation, with no divide-by-three required. The particular byte arrangement of the preferred embodiment set forth in FIG. 2, should not be construed as limiting the present invention thereto.

Referring once again to FIG. 2, data are read from or written to the byte locations within a given chunk 14 by one of eight possible 32-bit accesses. Six of the accesses are at a single memory address, while two are shared across a memory address pair. The bytes of the first chunk 14a (B00–B1F) are grouped by dashed lines according to 32-bit accesses. Thus, the locations of bytes B00–B03, B08–B0B, B0C-B0F, B10–B13, B14–B17 and B1C–B1F are each accessed by a single address 32-bit read or write, at memory addresses 0–5, respectively. The locations storing bytes B04–B07 and B18–B1B are accessed at memory address pairs 0–1, and 4–5, respectively. The 32-bit locations requiring two memory addresses to access are designated by the reference character 18, and will be referred to herein as "double-pump" locations.

In the preferred embodiment, the byte order arrangement is repeated for every chunk 14. Accordingly, the fifth through eighth bytes (B04–B07 in FIG. 2) of each chunk 14 will be situated at the first and second addressable locations 12a–b of that chunk 14. Likewise, the twenty-fifth through twenty-eighth bytes (B18–B1B) will be situated at the fifth and sixth addressable locations 12e–f within the chunk 14. This arrangement eliminates the possibility of a page break occurring within any 32-bit read or write (possible page break locations are depicted in FIG. 2).

Having described the memory array 10 arrangement of the present invention, a corresponding addressing system of a preferred embodiment will now be described.

Figure 3:
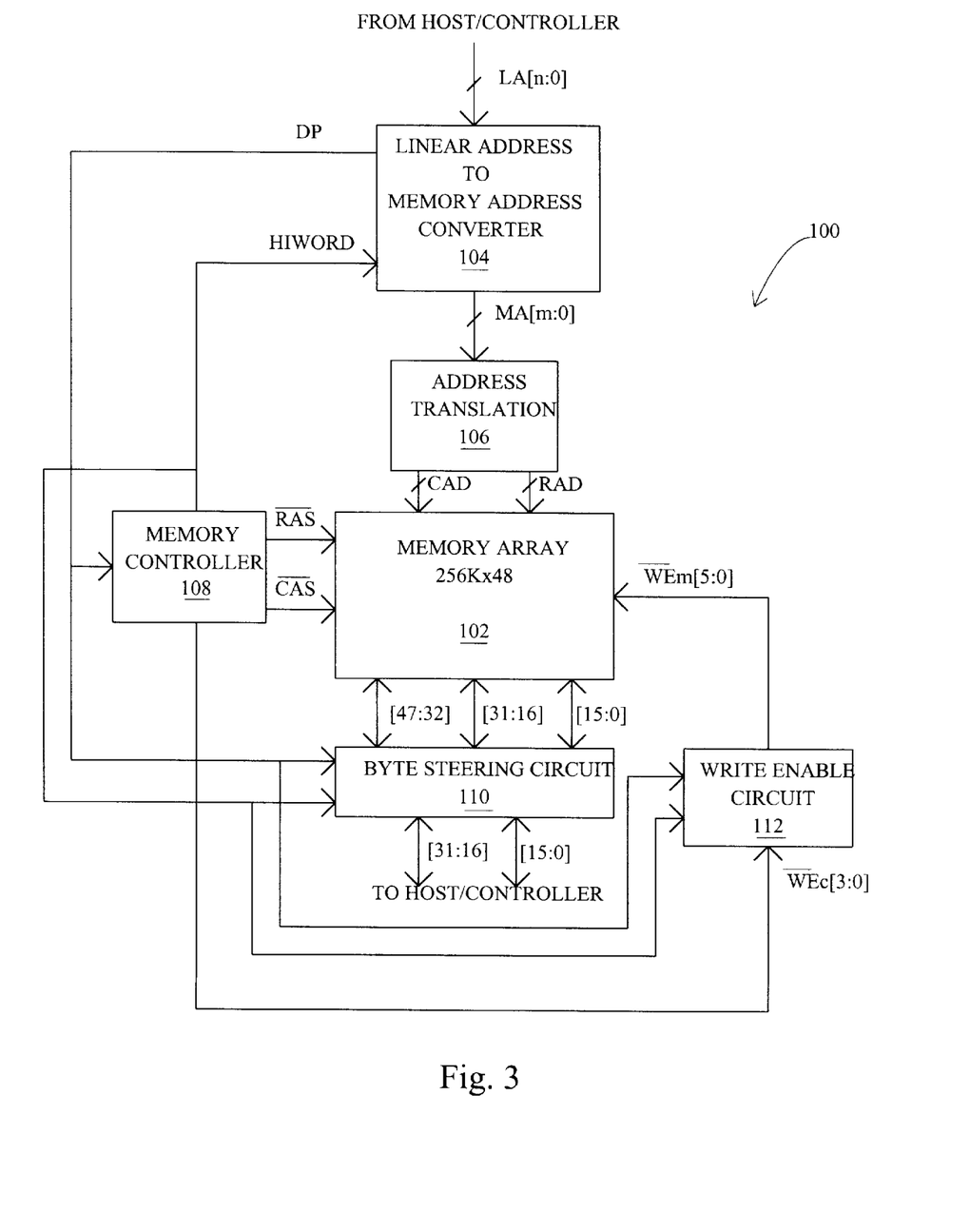
FIG. 3 is a block schematic diagram illustrating the memory array addressing system according to a preferred embodiment of the present invention.

FIG. 3 sets forth, generally, a block schematic diagram of an addressing system 100 according to a preferred embodiment of the present invention. The addressing system includes a memory array 102, a linear address-to-memory address (LA/MA) converter 104, an address translation circuit 106, a memory controller circuit 108, a byte steering circuit 110, and a write enable circuit 112 circuit.

The memory array 102 of the preferred embodiment is 256K×48 RAM composed of three, 256K×16 DRAMs. A linear address (LA) is received from a host or controller by the LA/MA converter 104. The LA is converted to a memory address (MA) which is applied to the address translation circuit 106. The address translation circuit 106 generates the corresponding row and/or column address (RAD and CAD) for the DRAMs of the memory array 102. Address translation circuits are well understood in the art and so will not be discussed in further detail herein.

In the preferred embodiment, the LA/MA converter 104 also generates a "double-pump" flag (DP) whenever an LA corresponding to a double-pump location 18 in the memory array 102 is received. The DP is applied to the memory controller 108, the byte steering circuit 110, and the write enable circuit 112. When DP is active (high), the memory controller 108 generates a two consecutive column address strobe ($\overline{CAS}$) signals and sequences a HIWORD signal, as will be described later. Otherwise, the memory controller 108 operation is conventional. According to the DP and HIWORD signals, the byte steering circuit 110 steers data to generate the byte order arrangement set forth in FIG. 2. The DP and HIWORD signals are also received by the write enable circuit 112 to allow write operations to take place for any byte within a given chunk 14.

Figure 4:
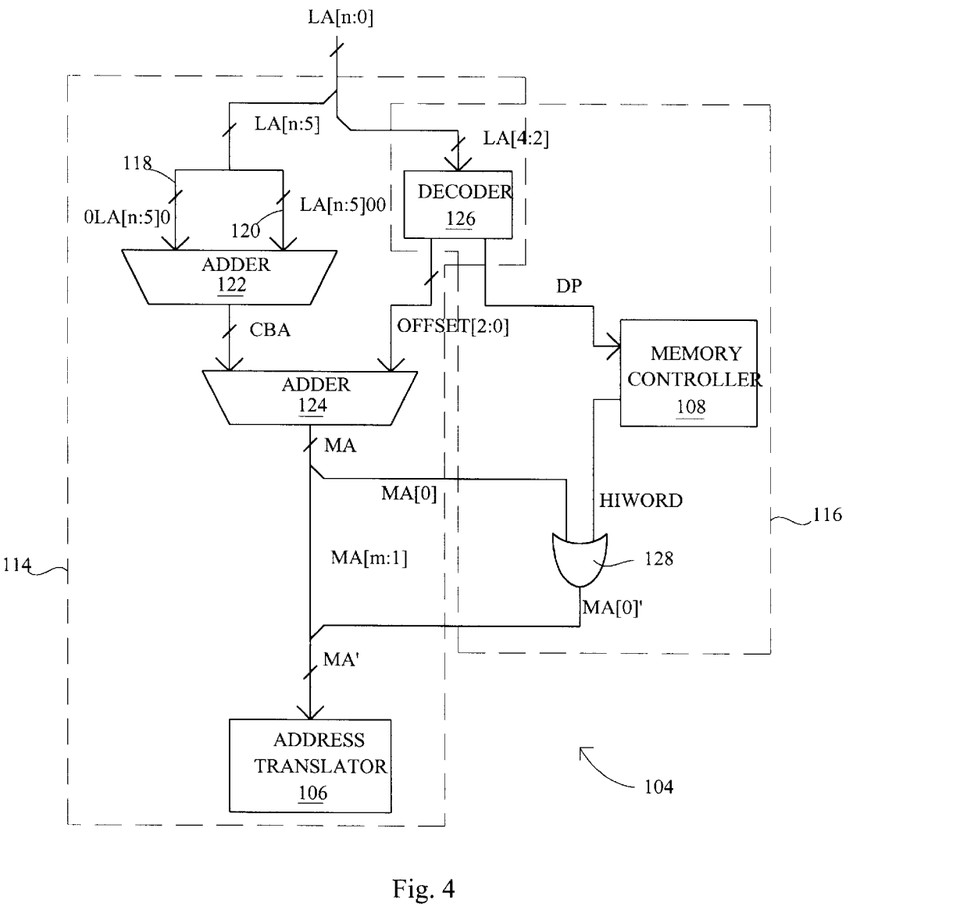
FIG. 4 is a block schematic diagram illustrating the linear address-to-memory address converter of a preferred embodiment of the present invention.

FIG. 4 illustrates the LA/MA converter 104 of a preferred embodiment. The LA/MA converter 104 can be conceptualized as including an address generating section 114 and an address incrementing section 116. The address generating section 114 includes a first shift path 118, a second shift path 120, a first adder 122, a second adder 124, and a decoder 126. The address incrementing section 116 also includes the decoder 126, the memory controller 108, and an OR gate 128. It is understood that the "shift paths" (118 and 120) contain no active devices and are provided to represent the shifting of one input of the first adder 122 with respect to the other input. The first adder 122, by accepting LA[n:5] on one input and the same value shifted by one bit at the other input, functions as a by-six multiplier circuit to generate an output equivalent to LA[n:5]*6. This output can be considered a chunk base address, which maps to the first memory address (12a in FIG. 2) of a given chunk 14. The chunk base address is summed with an OFFSET value (OFFSET[2:0]) in the second adder 124, to generate one of the six memory addresses within the chunk 14. OFFSET[2:0] is a three bit value generated by the decoder 126.

In a preferred embodiment, the decoder 126 receives the third through fifth bits of the linear address (LA[4:2]) and generates both the OFFSET[2:0] bits and the DP flag. A truth table describing the operation of the decoder 126 is set forth below in Table I.

TABLE I

| LA[4:2] | OFFSET[2:0] | DP |
|---------|-------------|----|
| 000     | 0           | 0  |
| 001     | 0           | 1  |
| 010     | 1           | 0  |
| 011     | 2           | 0  |
| 100     | 3           | 0  |
| 101     | 4           | 0  |
| 110     | 4           | 1  |
| 111     | 5           | 0  |

Accordingly, while only six different offset values are generated, two offset values (0 and 4) are generated in conjunction with an active double-pump flag, for a total of eight different OFFSET/DP combinations. These eight combinations correspond to the eight 32-bit locations in each chunk 14, with the two DP high cases corresponding to the two double-pump 32-bit locations 18.

While the preferred embodiment sets forth a particular decoding scheme, it is understood that other decoding schemes could be arrived at to select eight 32-bit locations from the six 48-bit addresses. Further, one skilled in the art would recognize that various logic circuits could be synthesized to generate the relationship described in Table 1. Accordingly, the decoder arrangement of the preferred embodiment should not be construed as limiting the present invention thereto.

While the preferred embodiment sets forth a LA/MA converter 104 having two adders, one skilled in the art could arrive at other alternative circuits. As just one example, a three-input adder could be used instead of the two, two-input adder arrangement. Accordingly, the particular arrangement set forth in FIG. 3, should not be considered limiting.

The address incrementing section 116 includes the DP decoding portion of the decoder 126. The DP signal is received by the memory controller which generates the HIWORD signal. As set forth in FIG. 4, the MA output of the second adder 124 has the least significant bit split off to create an MA[m:1] path and a one-bit MA[0] path. The MA[0] path is provided as an input to the OR gate 128. The other input to the OR gate 128 is the HIWORD signal. The output of the OR gate 128 MA[0]' is joined with the MA[m:1] path to create a modified memory address MA'. Thus, an active (high) HIWORD signal results in a switch (increment) in the least significant bit of the MA output. The address increment is used to select the memory address pairs of the double-pump 32-bit locations.

Referring back to FIG. 3, it is shown that the memory controller 108 of the preferred embodiment provides conventional control signals for the display memory devices, including the column address strobe ($\overline{CAS}$) and row address strobe ($\overline{RAS}$) signals necessary for the proper operation of the DRAMs. Memory controllers appropriate for accessing fast page, extended data out (EDO), synchronous, or other DRAM types could be used. These are well-known in the art, so only differences related to the present invention will be described.

Figure 5:
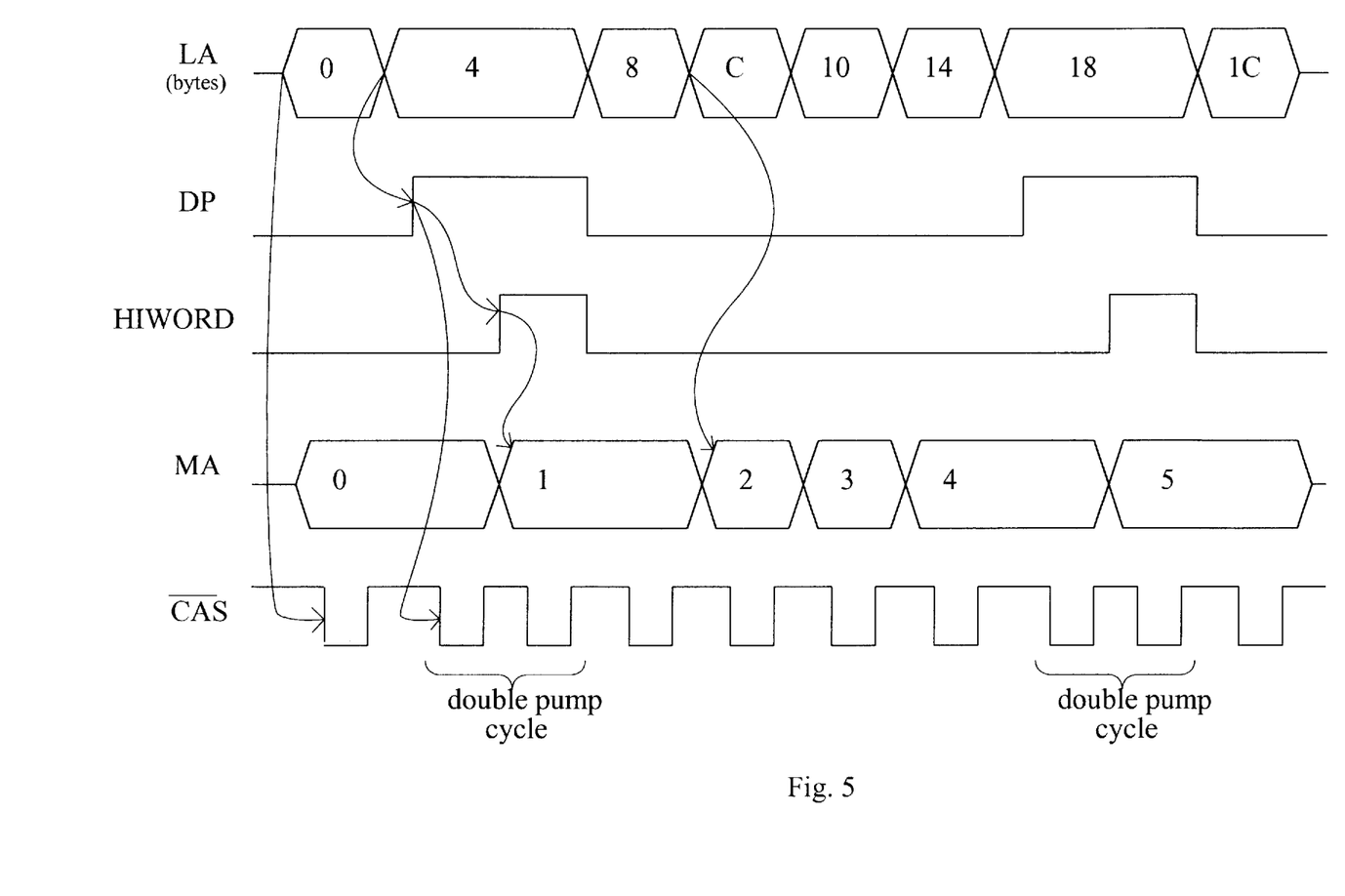
FIG. 5 is a timing diagram illustrating the operation of a preferred embodiment of the present invention.

The memory controller 108 of the present invention departs from prior art memory controllers by being responsive to the DP signal. Referring to FIG. 5, a timing diagram is provided to illustrate the operation of the memory controller 108. In FIG. 5, bytes B00–B1F (the first memory chunk 14 shown in FIG. 2) are read out in consecutive order. A series of eight linear byte addresses are set forth (LA 0–1C) with each address corresponding to four bytes. Linear addresses 4 and 18 cause the DP signal to go high (by operation of the decoder 126). In response to a high DP signal, the memory controller 108 generates two successive $\overline{CAS}$ signals. The memory controller 108 also forces HIWORD active (high) on the second of the successive $\overline{CAS}$ signals. Referring back to FIG. 4, it is recalled that the HIWORD signal is provided as an input to OR gate 128. Thus, when a double-pump location 18 is addressed, initially, a memory address is accessed by the first $\overline{CAS}$ signal. By construction of the decoder operation shown in Table I, this address is always even (MA[0]=0). The accessed memory address is then incremented by the HIWORD signal at OR gate 128, and the resulting second memory location is accessed by the second, successive $\overline{CAS}$ signal. In this manner, the two 16-bit portions of the 32-bit double-pump locations are accessed by a single decoded LA[4:2] combination.

Figure 6A:
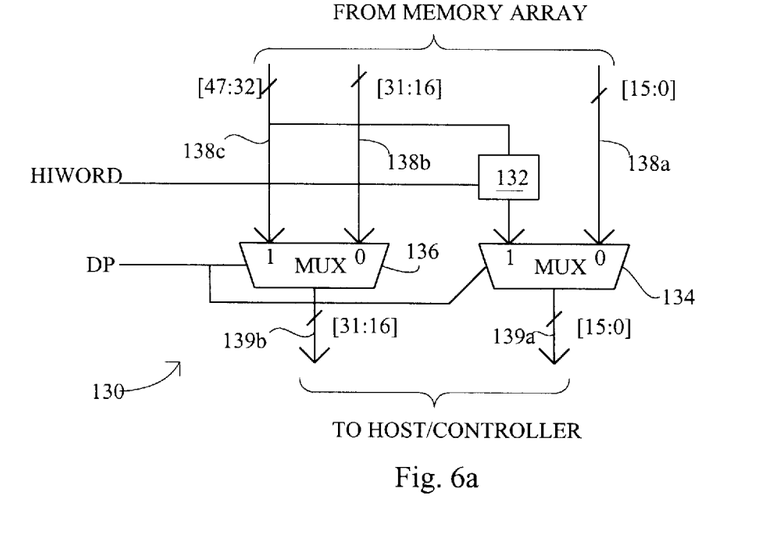
FIGS. 6a and 6b are block schematic diagrams illustrating the byte steering circuit of a preferred embodiment of the present invention.
Figure 6B:
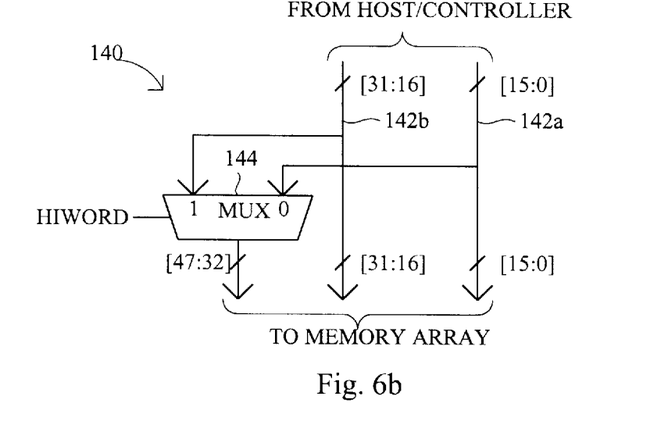

The byte steering circuit 110 of a preferred embodiment is illustrated in FIGS. 6a and 6b. FIG. 6a illustrates a read steering path 130 which is shown to include a data latch 132, a first read MUX 134, and a second read MUX 136. The read steering path 130 receives a 48-bit input from the memory array 102 which is divided into three, 16-bit memory read data paths 138a–c. The first memory data path 138a includes bits 15:0 and is provided as a first input to the first read MUX 134. The second memory read path 138b includes bits 31:16 and is provided as a first input to the second read MUX 136. The third memory read path 138c is provided as a second input to the second read MUX 136. The third memory read path is also provided as a second input to the first read MUX 134, via the data latch 132.

The first and second read MUXs (134 and 136) provide a first and second 16-bit read output 139a–b, respectively, and are commonly controlled by the DP and HIWORD signals. When DP is low, the first inputs of the read MUXs (134 and 136) are provided as outputs. Conversely, when DP and HIWORD are high, the second inputs of the read MUXs (134 and 136) are provided as outputs. In addition, the latch is enabled by the HIWORD signal. In this manner, during read operations in which the DP flag is low, the first 32-bits of each addressable location 12 of the memory array 102 are provided as an output. When DP is active, the last 16-bits of a first addressable location 12 are latched in the data latch 132. When HIWORD goes active, with DP still active, the latched data is provided as an output via MUX 134, and the last 16-bits of the next addressable location 12 are provided via the second read MUX 136.

Referring now to FIG. 6b, the write steering path 140 is shown to receive a 32-bit host/controller input and provides a 48-bit output to the memory array 102. The 32-bit input is divided into a first write path 142a and a second write path 142b, each of sixteen bits. The first write path 142a and second write path 142b are provided by a direct path to the first [15:0] and second sixteen bits [31:16] of the memory array output, respectively. In addition, the first and second write paths 142a–b are provided as first and second inputs to a write MUX 144. The write MUX 144 is responsive to the HIWORD signal. When HIWORD is inactive, the first write path 142a (bits [15:0]) is coupled to the upper sixteen bits [47:32] of the 48-bit memory array input. When HIWORD is active, the second write path 142b is coupled to the upper sixteen bits [47:32]. In this manner 32-bit data writes are steered into two, 16-bit memory locations, at two different memory addresses.

Figure 7:
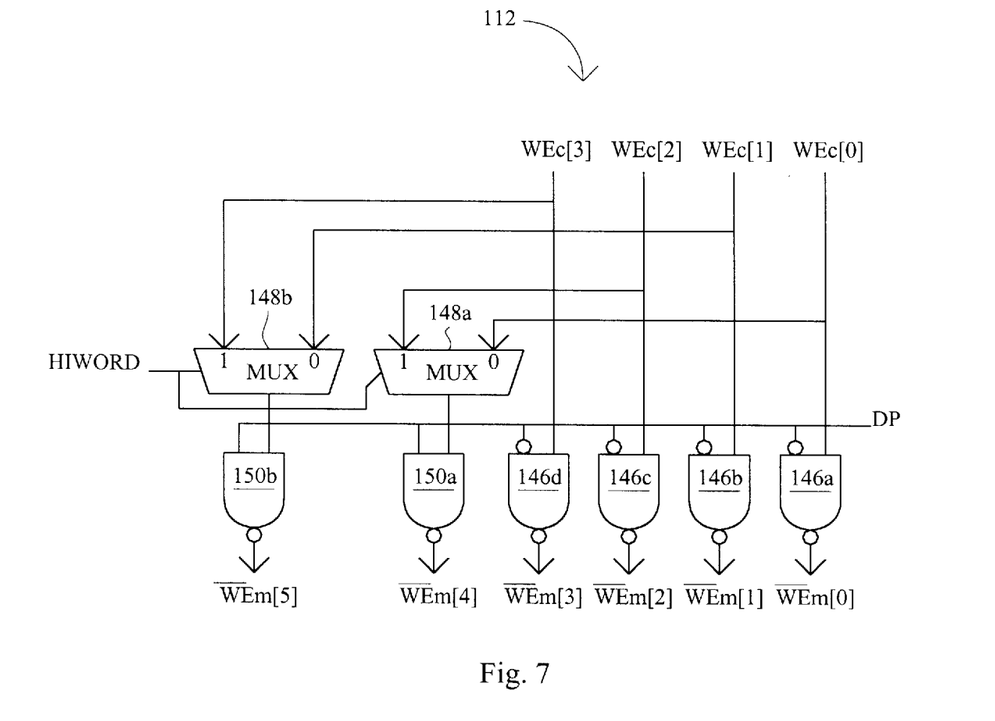
FIG. 7 is a block schematic diagram illustrating the write enable circuit of a preferred embodiment of the present invention.

FIG. 7 illustrates the write enable circuit 112 of a preferred embodiment. The write enable circuit 112 receives four host write enable bits (WEc[3:0]) from the host/controller, each for enabling a write to a particular byte within a given 32-bit word. The host write enable bits are shown as active high signals. The WEc[3:0] bits are translated by the write enable circuit 112 into six, active low, memory write enable bits (WEm[5:0]). The write enable circuit 112 is shown to include four, two-input NAND gates 146a–d, each having one inverting input, two write enable MUXs 148a–b, and two MUX NAND gates 150a–b. Each WEc bit is provided at the non-inverting input of one of the NAND gates 146a–d. In addition, WEc[0] and WEc[2] are provided to a first and second input, respectively, of the first write enable MUX 148a. WEc[1] and WEc[3] are provided as first and second inputs to the second write enable MUX 148b. The DP signal is commonly coupled to the inverting inputs of the NAND gates 146a–d and to one input of each MUX NAND gate 150a–b. The output of the first write MUX 148a is coupled to an input of the first MUX NAND gate 150a. The output of the second write MUX 148b is coupled to an input of the second MUX NAND gate 150b.

When the DP signal is inactive (low), MUX NAND gates 150a–b are disabled, and write enable bits WEm[5:4] are inactive. Hence, no writes may occur to the upper two bytes of a memory address. In contrast, the DP signal is inverted at the inputs of NAND gates 146a–d, and any selected combination of the lower four bytes at a memory address may be written to, according to the values of WEc[3:0].

When the DP signal is active (high), a double-pump cycle is indicated and NAND gates 146a–d are disabled and no data may be written to the lower four bytes of the memory address (WEm[3:0] are forced inactive). The MUX NAND gates 150a–b are enabled, and during the first part of the double pump cycle (DP active and HIWORD inactive), the host/controller write enable bits WEc[0]and WEc[1] correspond to the two upper memory write enable bits WEm[4] and WEm[5], respectively. During the second part of a double-pump cycle (DP active, HIWORD active), bits WEc [2] and WEc[3] correspond to the two upper memory write enable bits WEm[4] and WEm[5]. In this manner, any combination of the bytes making up the double pump locations 18 within the memory array 102 may be written to according to the values of WEc[3:0].

While the preferred embodiment reads 32-bit words, one skilled in the art would recognize the preferred embodiment could be modified to read 16 and/or eight bit words. In such a case, no "double-pump" operation would be necessary. A cycle with DP active and HIWORD inactive could read a first 16-bit word. The subsequent 16-bit word would be read by a cycle wherein DP is active and HIWORD is inactive.

Figure 8:
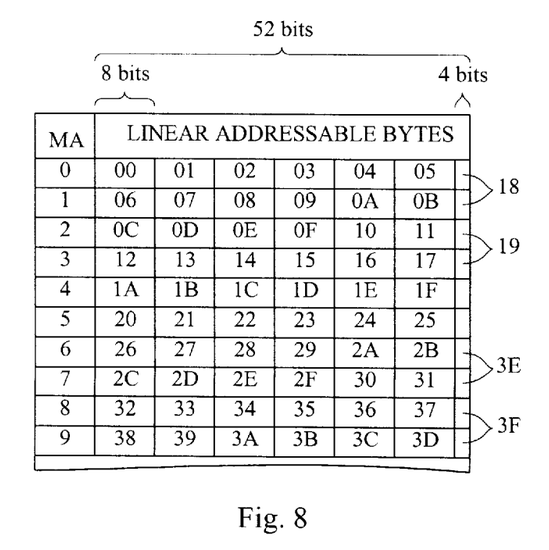
FIG. 8 is a diagrammatic representation of a memory array according to an alternate embodiment of the present invention.

It is also noted that the preferred embodiment could be modified to use more than two "pumps" per linear addressable word, with each pump accessing a partial word. An alternate embodiment accessing partial words is represented by FIG. 8. FIG. 8 sets forth a 52-bit wide display memory. Each memory address includes three, 16-bit linear addressed words, and a four bit quarter word. Selected linear addresses are accessed by four memory addresses (by a "quad" pump CAS operation). Address translation is achieved by a multiply by five operation (i.e. shift by two and add). A corresponding byte steering, write enable, and linear-to-memory address converter would obviously follow to one skilled in the art according to the teachings set forth herein.

It is therefore understood that the invention has been described in connection with its preferred embodiments, and may be changed, and other embodiments derived, without departing from the spirit and scope of the invention. Accordingly, the above disclosure is not intended to be limiting and the appended claims are to be interpreted as encompassing the entire scope of the invention.

What we claim is:

1. A memory system, comprising:
   a memory having a plurality of storage locations each being accessed at a particular memory address; and
   addressing means operable in
   a full use mode for accessing each memory address as an integral addressable unit, and
   a partial use mode for accessing a first portion of each memory address as an integral number of linear addressable units, and accessing a second portion of selected memory addresses as a fraction of selected linear addressable units, multiple second portions of selected memory addresses being addressed to access the selected linear addressable units.

2. The memory system of claim 1 wherein:
   each storage location of said memory includes 48-bits; and
   said addressing means is operable
   in the full use mode to access a 48-bit addressable unit at each memory address, and
   in the partial use mode to access a 32-bit portion of each memory address as one linear addressable unit, and to address 16-bit portions of two selected memory addresses to access selected 32-bit linear addressable units.

3. The memory system of claim 1 wherein:
   each storage location of said memory includes 52-bits; and
   said addressing means is operable
   in the full use mode to access a 52-bit addressable unit at each memory address, and
   in the partial use mode to access a 48-bit portion of each memory address as three 16-bit linear addressable units, and to address 4-bit portions of four selected memory address to access selected 16-bit linear addressable units.

4. The memory system of claim 1 wherein:
   said memory is comprised of dynamic random access memory (DRAM) devices that are controlled by row address strobe (RAS) signals and column address strobe signals (CAS); and
   said addressing means includes control means operable in the partial use mode for generating multiple CAS signals in conjunction with the same RAS signal to access the first and second portions of each memory address.

5. The memory system of claim 1 wherein:

said addressing means includes shift means and add means for shifting and adding a first portion of a linear address to generate a chunk base memory address, and decode means for decoding a second portion of the linear address to generate one memory address for those linear addressable units in first portions of memory addresses, and to generate multiple memory addresses for those selected linear addressable units in multiple memory addresses.

6. In a computer system that generates a plurality of linear addresses for accessing data in a memory array, the memory array having a plurality of storage locations, each storage location being accessed by a memory address, wherein two of every three storage locations are packed and one of every three storage locations, is partially filled with data, a method of addressing the memory array as a linear and contiguous region of addressable units of a predetermined bit length, comprising the steps of:

multiplying upper bits of the linear address by 3N where N is an integer, to generate a chunk base memory address; and generating at least a first three memory addresses and at least a first memory address pair from the chunk base memory address and lower bits of the linear address, each of the first three memory addresses corresponding to three addressable units, the first memory address pair corresponding to a fourth addressable unit.

7. The method of claim 6 wherein:

generating at least a first three memory addresses and at least a first memory address pair includes generating an offset value from the lower bits, and adding the offset value to the chunk base address.

8. The method of claim 6 including:

N being equal to two (2); and the further step of generating a second three memory addresses and a second memory address pair for a total of six memory addresses, the six memory addresses being six consecutive memory addresses beginning with the chunk base address and ending at the chunk base address plus five (5), each memory address pair including two of the consecutive memory addresses.

9. The method of claim 8 wherein:

for each of the six consecutive memory addresses, in a write operation, byte steering data to a first storage portion at the memory address, and in a read operation, byte steering data from the first storage portion at the memory address; and for each of the two memory address pairs, in a write operation, splitting data into a first data segment and a second data segment, and byte steering the first data segment and second data segment into second storage portions of the memory address pair, and in a read operation, concatenating data from the second storage portions of the memory address pair.

10. The method of claim 9 wherein:

generating the memory address pair includes generating one of the consecutive memory addresses, and logically ORing it with the value one (1).

11. The method of claim 8 wherein:

for each of the six consecutive memory addresses, in a write operation, steering host/controller write enable signals to memory write enable inputs that correspond to the first portion at the memory addresses; and for each of the two memory address pairs, in a write operation, splitting write enable signals into a first write enable group and second write enable group, and steering the first and second write enable groups to memory write enable inputs corresponding to the second portions of the memory address pairs.

12. A memory addressing system, comprising:

a memory including a plurality of storage locations, each storage location being addressable by a memory address and being M bits wide, where M is a multiple of three;

a linear address-to-memory address (LA/MA) converter for generating six memory addresses for six of eight linear addresses, and for further generating a memory address pair for the remaining two of the eight linear addresses; and a memory controller for generating memory control signals for accessing storage locations within said memory, said memory controller generating two consecutive control signals in response to the memory address pair.

13. The system of claim 12 wherein:

said LA/MA converter includes a multiplier circuit for receiving a first portion of a linear address and multiplying it by six to generate a chunk base address, a decoder for receiving a three bit second portion of a linear address, said decoder generating six offset values and two offset value/flag combinations in response to the eight permutations of the three bit second portion, an adder circuit for adding the offset value to the chunk base address to generate a memory address.

14. The system of claim 12 including:

a byte steering circuit for steering data to and from a first portion of a memory location in response to a memory address, and steering data to and from a second portion of the memory address pairs.

15. The system of claim 12 wherein:

the offset values include zero through five, and one of the offset bit/flag combinations is a combination of the zero offset value and the flag.

16. The system of claim 15 wherein:

the other offset bit/flag combination is a combination of the offset value four, and the flag.

* * * * *